United States Patent [19]
Ito

[11] Patent Number: 5,159,288
[45] Date of Patent: Oct. 27, 1992

[54] RECEIVER CIRCUIT HAVING FIRST AND SECOND AMPLIFIERS

[75] Inventor: Hidenobu Ito, Aichi, Japan

[73] Assignees: Fujitsu Limited, Kawasaki; Fujitsu VLSI Limited, Kasugai, both of Japan

[21] Appl. No.: 729,883

[22] Filed: Jul. 11, 1991

Related U.S. Application Data

[63] Continuation of Ser. No. 580,994, Sep. 12, 1990, abandoned.

[30] Foreign Application Priority Data

Sep. 20, 1989 [JP] Japan .................................. 1-244555

[51] Int. Cl.$^5$ .............................................. H03F 3/68
[52] U.S. Cl. ................... 330/289; 330/256; 330/296; 330/266
[58] Field of Search ............... 330/289, 296, 297, 202, 330/203, 310, 256, 266, 272

[56] References Cited

U.S. PATENT DOCUMENTS

| | | | |
|---|---|---|---|
| 3,195,065 | 7/1965 | Grant | 330/289 |
| 3,395,359 | 7/1968 | Zachev | 330/256 |
| 3,531,733 | 9/1970 | Haines | 330/256 |
| 3,755,751 | 8/1973 | Ring | 330/207 P |
| 4,101,841 | 7/1978 | Okada et al. | 330/289 |
| 4,454,480 | 7/1984 | Allfather et al. | 330/310 |
| 4,476,441 | 10/1984 | Gulczynski | 330/262 |

Primary Examiner—Eugene R. LaRoche
Assistant Examiner—Tan Dinh
Attorney, Agent, or Firm—Armstrong & Kubovcik

[57] ABSTRACT

A receiver circuit includes a first amplifier for amplifying an input signal and for outputting a first amplified signal, a first bias circuit coupled to the first amplifier for supplying a first bias current to the first amplifier, where the first amplifier and the first bias circuit form a first circuit part, a second amplifier coupled to the first amplifier for amplifying the first amplified signal output from the first amplifier and for outputting a second amplified signal as an output signal of the receiver circuit, and a second bias circuit coupled to the second amplifier for supplying a second bias current to the second amplifier, where the second amplifier and the second bias circuit form a second circuit part, and the first and second bias circuits are independent of each other and have mutually opposite temperature characteristics so that the first and second bias currents respectively change in mutually opposite directions with increasing ambient temperature, to thereby suppress a change in current consumption of the receiver circuit as a whole. According to the receiver circuit of the present invention, it is possible to stabilize the operation and current consumption of the receiver circuit with respect to the change in ambient temperature, and thus, it is possible to improve the detection accuracy of the receiver circuit especially with respect to a weak input signal.

9 Claims, 5 Drawing Sheets

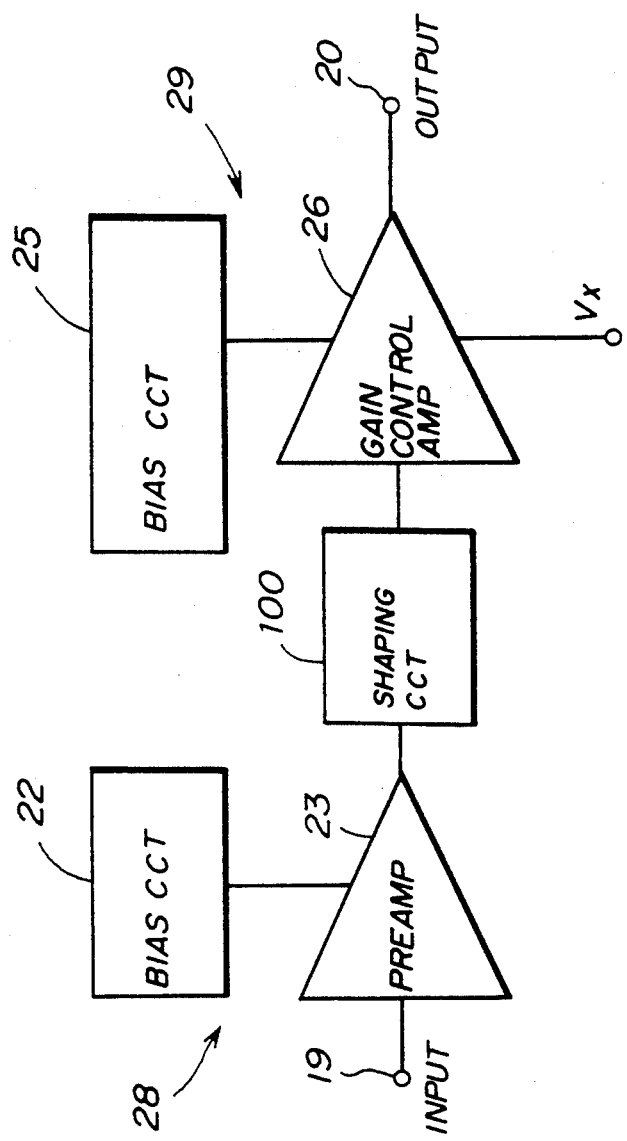
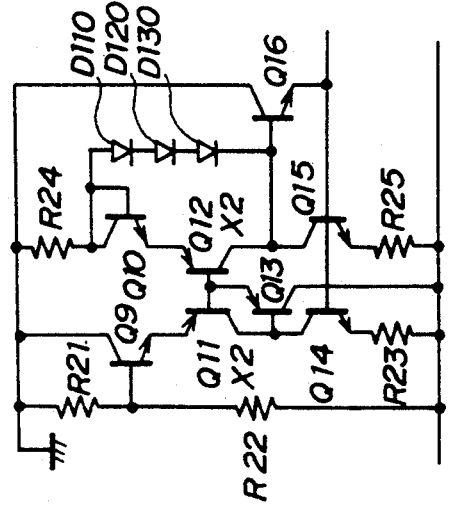

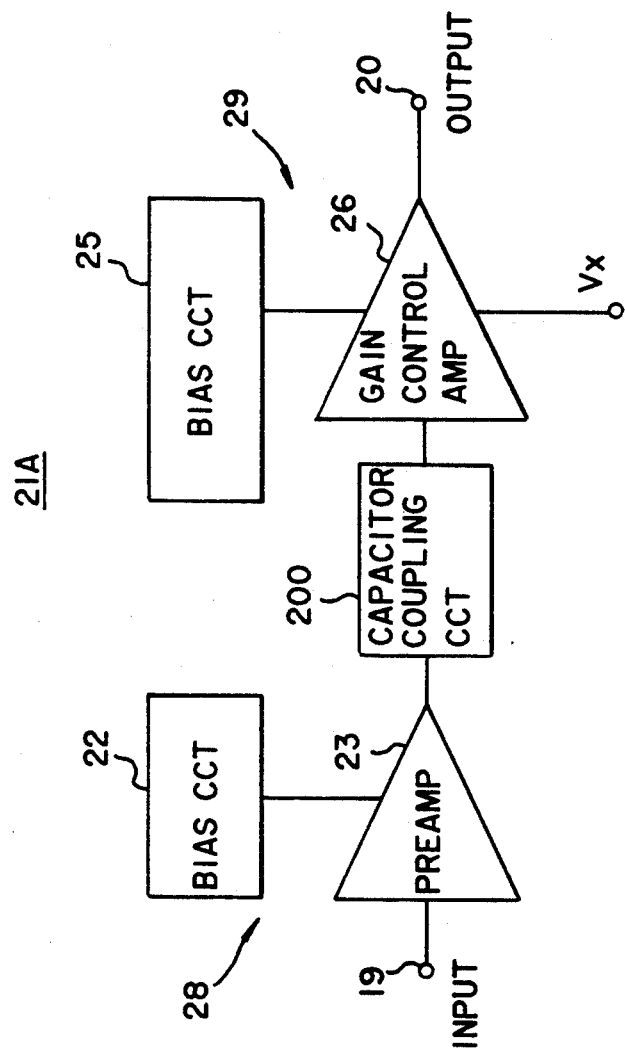

RECEIVER CIRCUIT HAVING FIRST AND SECOND AMPLIFIERS

This application is a continuation of application Ser. No. 07/580,994 filed Sep. 12, 1990 now abandoned.

BACKGROUND OF THE INVENTION

The present invention generally relates to receiver circuits, and more particularly to a receiver circuit which detects a weak signal and amplifies the signal to an amplitude suited for a predetermined signal processing. The receiver circuit according to the present invention is particularly suited for receiving a detection signal which is output from a sensing device such as a computer tomography device.

Recently, there are demands to realize a receiver circuit having a high gain, a wide frequency band and a stable characteristic in response to a detection signal which is weak and has a wide frequency band to suit various environments in which the receiver circuit is used. For this reason, there is a proposed receiver circuit which uses a discrete preamplifier and a general purpose multiplier which are discrete. However, such a proposed receiver circuit is easily affected by a change in the ambient temperature. In other words, the characteristic of the receiver circuit deteriorates and the detection accuracy becomes poor due to the increase in current consumption, and there is a need to stabilize both the characteristic and the detection accuracy of the receiver circuit regardless of the ambient temperature change.

FIG. 1 shows an example of a conventional receiver circuit. A receiver circuit 1 shown in FIG. 1 includes a preamplifier 2 which amplifies an input detection signal from an input terminal 4 to a suitable amplitude, and a general multiplier 3 which gives an arbitrary gain to an amplified output signal of the preamplifier 2 and outputs an amplified detection signal via an output terminal 5. The preamplifier 2 and the general purpose multiplier 3 are discrete. For example, the input detection signal applied to the input terminal 4 is output from a computer tomography device (not shown).

When the preamplifier 2 receives a weak detection signal, the preamplifier 2 amplifies the weak detection signal to a suitable amplitude which can be processed in the general purpose multiplier 3. Hence, the general purpose multiplier 3 amplifies the output signal of the preamplifier 2 with the arbitrary gain so as to obtain the output detection signal which has a desired amplitude.

However, the receiver circuit 1 is a simple combination of the preamplifier 2 and the general purpose multiplier 3 which are discrete. As a result, the temperature characteristics of the preamplifier 2 and the general purpose multiplier 3 do not match, and consequently, the characteristic of the receiver circuit 1 deteriorates and the current consumption increases. In other words, when the ambient temperature changes, there are problems in that the operation of the receiver circuit 1 becomes unstable, the detection accuracy especially with respect to the weak signal becomes poor and the power consumption of the receiver circuit 1 increases.

That is, when the receiver circuit 1 is simply designed from the preamplifier 2 and the general purpose multiplier 3, the current consumption of the receiver circuit 1 changes because the receiver circuit 1 as a whole has a temperature characteristic. For this reason, when the receiver circuit 1 is connected within a system, the system must have a power source which can cope with the change in the current consumption of the receiver circuit 1. For example, in a case where the power source of the system only has a capacity sufficient to drive the receiver circuit 1 at room temperature when the current consumption is relatively small, the characteristic of the receiver circuit 1 deteriorates when the current consumption increases because the power source of the system can no longer satisfactorily drive the receiver circuit 1.

SUMMARY OF THE INVENTION

Accordingly, it is a general object of the present invention to provide a novel and useful receiver circuit in which the problems described above are eliminated.

Another and more specific object of the present invention is to provide a receiver circuit comprising an input terminal for receiving an input signal, a first amplifier coupled to the input terminal for amplifying the input signal and for outputting a first amplified signal, a first bias circuit coupled to the first amplifier for supplying a first bias current to the first amplifier, where the first amplifier and the first bias circuit form a first circuit part, a second amplifier coupled to the first amplifier for amplifying the first amplified signal output from the first amplifier and for outputting a second amplified signal, a second bias circuit coupled to the second amplifier for supplying a second bias current to the second amplifier, where the second amplifier and the second bias circuit form a second circuit part, and an output terminal coupled to the second amplifier for outputting the second amplified signal output from the second amplifier as an output signal of the receiver circuit. The first and second bias circuits are independent of each other and have mutually opposite temperature characteristics so that the first and second bias currents respectively change in mutually opposite directions with increasing ambient temperature, to thereby suppress a change in current consumption of the receiver circuit as a whole. According to the receiver circuit of the present invention, it is possible to stabilize the operation and current consumption of the receiver circuit with respect to the change in ambient temperature, and thus, it is possible to improve the detection accuracy of the receiver circuit especially with respect to a weak input signal.

Other objects and further features of the present invention will be apparent from the following detailed description when read in conjunction with the accompanying drawings.

BRIEF DESCRIPTION OF THE DRAWINGS

FIG. 4 is a circuit diagram showing a modification of a second bias circuit shown in FIG. 3; and FIG. 5 is a system block diagram showing a second embodiment of the receiver circuit according to the present invention.

FIG. 6 is a system block showing another embodiment of the receiver circuit according to the present invention.

DESCRIPTION OF THE PREFERRED EMBODIMENTS

Figure 1:
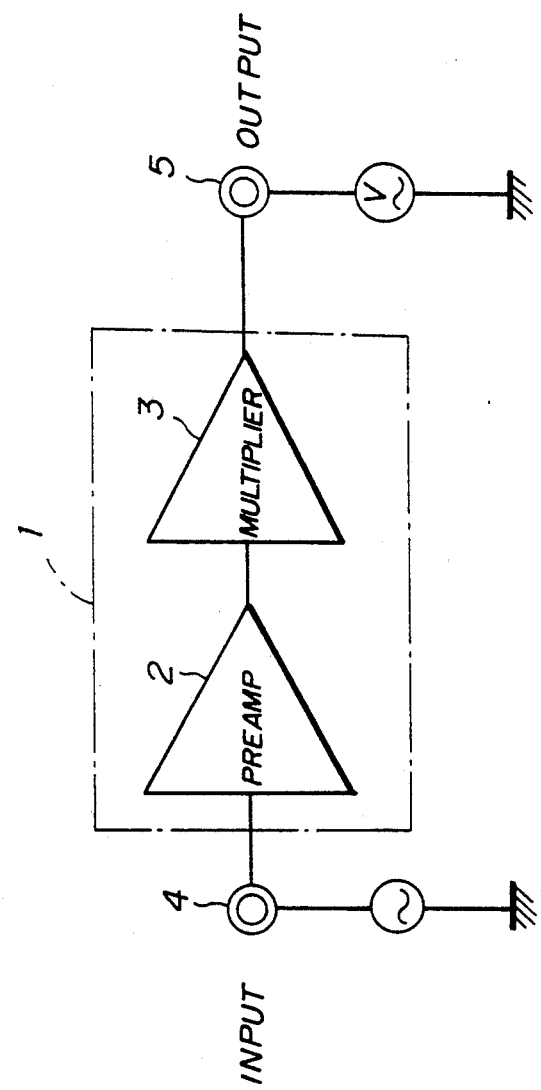
FIG. 1 is a system block diagram showing an example of a conventional receiver circuit.
Figure 2:
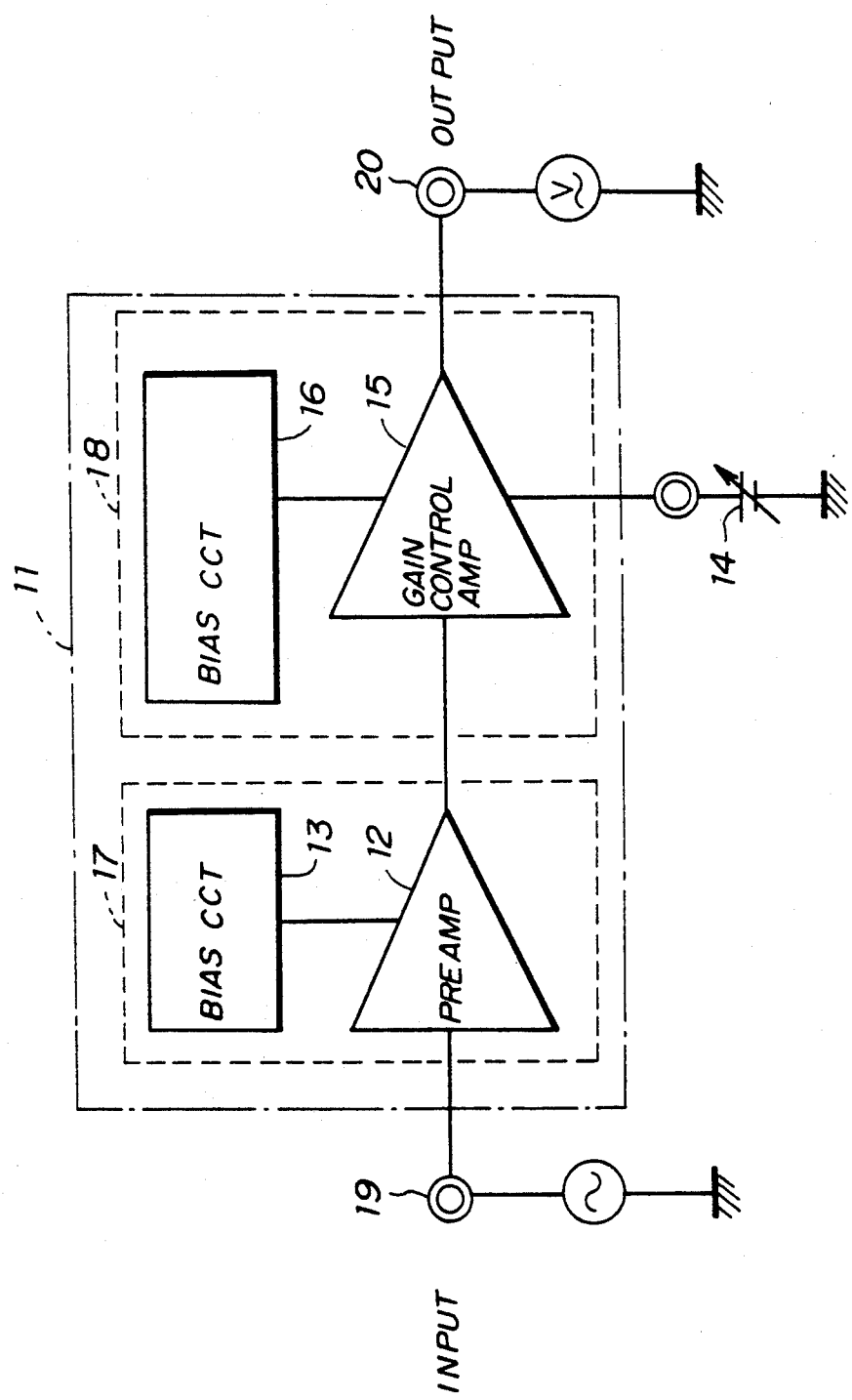
FIG. 2 is a system block diagram for explaining an operating principle of a receiver circuit according to the present invention.

First, a description will be given of an operating principle of a receiver circuit according to the present invention, by referring to FIG. 2. A receiver circuit 11 shown in FIG. 2 includes a preamplifier 12, a first bias circuit 13, a gain control amplifier 15 and a second bias circuit 16 which are connected as shown. The preamplifier 12 amplifies an input detection signal from an input terminal 19 to a suitable amplitude. For example, the input detection signal is output from a computer tomography device (not shown). The first bias circuit 13 supplies a predetermined bias current to the preamplifier 12. The gain control amplifier 15 includes a multiplying circuit for multiplying to an amplified output signal of the preamplifier 12 a predetermined gain which is determined by a gain control voltage 14. The second bias circuit 16 supplies a predetermined bias current to the gain control amplifier 15. An amplified output signal of the gain control amplifier 15 is output via an output terminal 20. The preamplifier 12 and the first bias circuit 13 form a preamplifier part 17. The gain control amplifier 15 and the second bias circuit 16 form a gain control amplifier part 18.

The first bias circuit 13 functions as a bias source for the preamplifier 12 and determines the characteristic of the preamplifier 12. The second bias circuit 16 functions as a bias source for the gain control amplifier 15 and determines the characteristic of the gain control amplifier 15. Because the bias sources for the preamplifier 12 and the gain control amplifier 15 are independent, it is possible to independently stabilize the operations of the preamplifier 12 and the gain control amplifier 15 with respect to a temperature change. For the stabilization, a temperature characteristic is positively given to the bias sources so as to maintain the input/output relationship constant for both the preamplifier 12 and the gain control amplifier 15.

For example, when the preamplifier part 17 and the gain control amplifier part 18 both have a characteristic such that the bias current increases with increasing in temperature, it is possible to improve the temperature characteristic of the receiver circuit 11 but the power consumption of the receiver circuit 11 increases. Accordingly, the first bias circuit 13 of the preamplifier part 17 has a positive temperature characteristic in which the current consumption increases with an increase in temperature so that the operation of the preamplifier 12 is stabilized. On the other hand, the second bias circuit 16 of the gain control amplifier part 18 has a negative temperature characteristic in which the bias current decreases with increasing temperature. As a result, the preamplifier part 17 and the gain control amplifier part 18 respectively operate stably even when a temperature change occurs, and the receiver circuit 11 is controlled so that the current consumption as a whole is constant. In other words, if the first and second bias circuits for preamplifier part and the gain control amplifier part of the receiver circuit were designed to have arbitrary temperature characteristics, the current consumption of the receiver circuit may change with a temperature change. However, in the present invention, the first and second bias circuits 13 and 16 have mutually opposite temperature characteristics such that the change in the current consumption is mutually opposite between the preamplifier part 17 and the gain control amplifier part 18. As a result, the current consumption of the receiver circuit 11 as a whole is maintained constant. It should be noted that the input characteristic and the output characteristic themselves of the receiver circuit 11 do not have the temperature characteristic, and the signal does not change in response to the temperature change. The temperature characteristic is such that only the power consumption changes in response to the temperature change.

It is also possible to give the first bias circuit 13 a negative temperature characteristic in which the current consumption decreases with increasing in temperature and give the second bias circuit 16 a positive temperature characteristic in which the bias current increases with increasing temperature.

But when the first bias circuit 13 has the positive temperature characteristic and the second bias circuit 16 has the negative temperature characteristic, for example, the preamplifier 12 can operate stably even at high frequencies.

Therefore, according to the present invention, it is possible to prevent the characteristic of the receiver circuit from deteriorating due to a change in ambient temperature. In addition, it is possible to prevent the current consumption of the receiver circuit from increasing in response to the change in ambient temperature and improve the detection accuracy of the receiver circuit.

Next, a description will be given of a first embodiment of the receiver circuit according to the present invention, by referring to FIG. 3.

Figure 3:
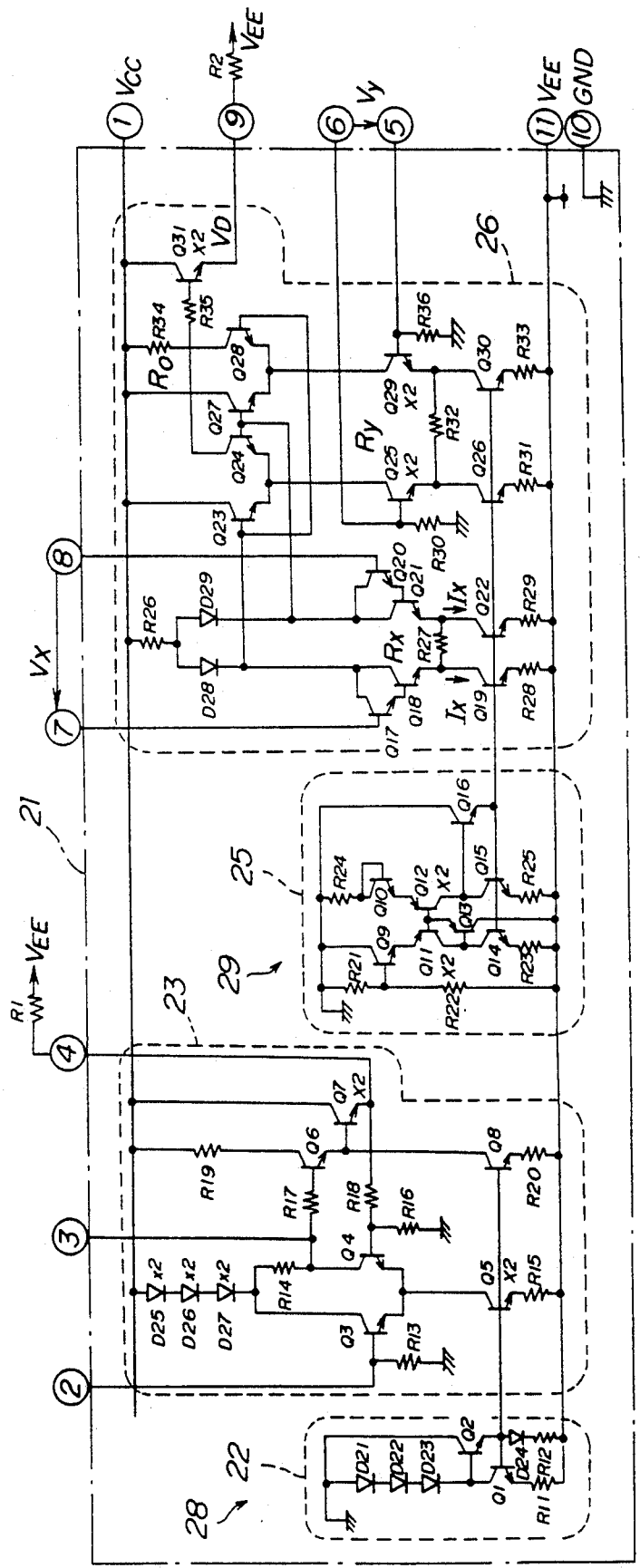
FIG. 3 is a circuit diagram showing a first embodiment of the receiver circuit according to the present invention.

A receiver circuit 21 shown in FIG. 3 includes a first bias circuit 22, a preamplifier 23 which is driven by a bias current from the first bias circuit 22, a second bias circuit 25, a gain control amplifier 26 which is driven by a bias current from the second bias circuit 25, and external terminals "1" through "11" which are indicated in circles. A power source voltage $V_{CC}$ having the higher potential is applied to the external terminal "1". The external terminal "10" is grounded to a ground potential GND. A power source voltage $V_{EE}$ having the lower potential is applied to the external terminal "11". The power source voltage $V_{EE}$ is applied to the external terminal "4" via a resistor R1, and the power source voltage $V_{EE}$ is applied to the external terminal "9" via a resistor R2. A main input voltage $V_Y$ is applied across the external terminals "6" and "5", and a gain control voltage $V_X$ is applied across the external terminals "8" and "7". An input signal to the preamplifier 23 is applied to the external terminal "2", an output signal of the preamplifier 23 is obtained from the external terminal "4", an input signal (main input voltage $V_Y$) to the gain control amplifier 26 is applied across the external terminals "6" and "5", and an output signal of the gain control amplifier 26 (the receiver circuit 21) is obtained via the external terminal "9". A signal for phase compensation may be applied to the external terminal "3". The first bias circuit 22 and the preamplifier 23 form a preamplifier part 28, and the second bias circuit 25 and the gain control amplifier 26 form a gain control amplifier part 29.

The first bias circuit 22 includes transistors Q1 and Q2, diodes D21 through D24, and resistors R11 and R12 which are connected as shown. The preamplifier 23 includes transistors Q3 through Q8, diodes D25 through D27, and resistors R13 through R20 which are connected as shown. The second bias circuit 25 includes transistors Q9 through Q16, and resistors R21 through R25 which are connected as shown. The gain control amplifier 26 includes transistors Q17 through Q31, diodes D28 and D29, and resistors R26 through R36 which are connected as shown. In FIG. 3, those transistors having a symbol "x2" on the side indicates that the transistor size is doubled compared to that of other transistors. The diodes D21 through D29 may respectively be formed by a transistor having a diode connection, that is, a transistor having its base and collector connected.

A description will now be given of the operation of the first embodiment. When it is assumed that a bias current of the transistor Q5 is constant in the preamplifier 23, the output point of the transistor Q7 changes and an offset is generated because a temperature characteristic of a base-emitter voltage $V_{BE}$ of a transistor is independent of a temperature characteristic of a resistor. A feedback system of the preamplifier 23 becomes extremely unstable because of the generated offset. Accordingly, measures are taken so that the offset is not generated. In this embodiment, this is achieved by giving the first bias circuit 22 a predetermined temperature characteristic so that the output point of the transistor Q7 becomes constant. This predetermined temperature characteristic is such that the bias current increases with increasing temperature. Particularly, the preamplifier part 28 operates with reference to the positive and negative power source voltages $V_{CC}$ and $V_{EE}$, and the operation of the preamplifier is stable when the output thereof has the ground potential GND when there is no input signal and is unstable when the output thereof deviates from the ground potential GND when there is no input signal. In addition, the first bias circuit 22 operates between the ground potential GND and the power source voltage $V_{EE}$, and includes the diodes D21 through D24 and the transistors Q1 and Q2 which amount to five stages of base-emitter voltages $V_{BE}$ and the resistor R1 which has a resistance of 1.1 kΩ, for example. On the other hand, the preamplifier 23 includes the diodes D25 through D27 and the transistors Q6 and Q7 which amount to five stages of base-emitter voltages $V_{BE}$ and the resistor R14 which has a resistance of 1.1 kΩ, for example. Accordingly, the output point of the transistor Q7 is stabilized to the vicinity of the ground potential GND when there is no input signal to the preamplifier 23.

With regard to the temperature characteristic, the resistor and the base-emitter voltage $V_{BE}$ of the transistor display completely independent temperature characteristics. Hence, the temperature characteristic of the preamplifier 23 would greatly change with the circuit structure shown. However, the first bias circuit 22 also displays a similar temperature characteristic. For this reason, the voltage generated in the preamplifier 23 (emitter output of the transistor Q7) is output appropriately and the preamplifier part 28 as a whole has a characteristic which is stable with respect to the temperature. The current consumption of the preamplifier part 28 increases as described above, so as to prevent deterioration of the gain and the phase margin.

On the other hand, when the main input voltage $V_Y$ is applied to the gain control amplifier part 29, a current difference which is determined by the main input voltage $V_Y$ and a resistance $R_Y$ of the resistor R32 is introduced between the collector currents of the transistors Q25 and Q29 which form a differential pair and a current flowing through the resistor R34 having a resistance $R_O$ changes. The transistors Q24 and Q27 apply to the resistor R34 ($R_O$) the changes in the collector currents of the transistors Q25 and Q29 with a predetermined ratio dependent on the gain control voltage $V_X$. The collector current of the transistor Q25 is supplied to the transistors Q23 and Q24 with a predetermined ratio, and the collector current of the transistor Q29 is supplied to the transistors Q28 and Q27 with a predetermined ratio. As a result, portions of the collector currents of the transistors Q25 and Q29 flow to through the respective transistors Q23 and Q28 to form the multiplying circuit. The predetermined ratios described above are determined by the gain control voltage $V_X$, and the gain of the gain control amplifier 26 is controlled by the gain control voltage $V_X$.

The current flowing through the resistor R27 having a resistance $R_X$ changes depending on the gain control voltage $V_X$. Hence, the current currents flowing through the diodes D28 and D29 change and the voltages across the diodes D28 and D29 accordingly change. In this case, the potentials at the emitter sides of the diodes D28 and D29 change because the base-collector sides of the diodes D28 and D29 are connected to the same node. Furthermore, the base potentials of the diodes D28 and D29 change because the emitter of the diode D28 is connected to the bases of the transistors Q23 and Q28 and the emitter of the diode D29 is connected to the bases of the transistors Q24 and Q27. In addition, since the emitters of the transistors Q23 and Q24 are connected and the emitters of the transistors Q27 and Q28 are connected, the currents flowing through the transistors Q23 and Q24 and the transistors Q27 and Q28 change when the base potentials of the diodes D28 and D29 change. The current flowing through the transistors Q23 and Q24 and the current flowing through the transistors Q27 and Q28 have the predetermined ratio described above.

When the ambient temperature changes, the bias current and the like also change. The change in the main input voltage $V_Y$ appears as a change in the current flowing through the resistor R32. The resistor R32 has a temperature characteristic, and thus, the current change component due to the main input voltage $V_Y$ also has a temperature characteristic. However, no problems are introduced because the temperature characteristic of the resistor R32 is cancelled by the resistor R34.

Similarly, the change in the gain control voltage $V_X$ appears as a change in the current flowing through the resistor R27. The resistor R27 has a temperature characteristic, and thus, the predetermined ratio of the currents flowing through the transistors Q18 and Q21 also has a temperature characteristic. As a result, the change in the gain control voltage $V_X$ appears as a change in the output signal of the gain control amplifier part 29. In order to cancel the temperature characteristic of the resistor R27, the second bias circuit 25 gives a temperature characteristic to a current $I_X$ which flows through the transistors Q19 and Q22. The second bias circuit 25 generates a reference voltage by the resistors R21 and R22, and the second bias circuit 25 has a circuit structure such that this reference voltage appears across the resistor R24 which is coupled to the transistors Q10 and Q12. When the transistors Q15 and Q14 are set so that the currents flowing through the transistors Q9 and Q11 and the transistors Q10 and Q12 become the same, the base-emitter voltages $V_{BE}$ of the transistors Q9 and Q10 become the same and the base-emitter voltages $V_{BE}$ of the transistors Q11 and Q12 also become the same. In other words, the base potential of the transistor Q10 is obtained as the base potential of the transistor Q9 minus a drop of the base-emitter voltage $V_{BE}$ of the transistor Q9 minus a drop of the base-emitter voltage $V_{BE}$ of the transistor Q11 plus a rise of the base-emitter voltage $V_{BE}$ of the transistor Q12 plus a rise of the base-emitter voltage $V_{BE}$ of the transistor Q10, and the base potentials of the transistors Q9 and Q10 are the same.

The currents flowing through the transistors Q14 and Q15 are determined by the voltage across the resistor R24 which is connected between the base of the transistor Q10 and the ground GND. Because the resistor R24 has a temperature characteristic, the currents flowing through the transistors Q14 and Q15 are determined by the temperature characteristic of the resistor R24 and are used as the bias currents $I_X$. Accordingly, the bias currents $I_X$ have the temperature characteristic of the resistor R24. Since the voltage across the resistor R24 is constant, the voltage across the resistor R27 which is generated by the current flowing through the resistor R27 becomes constant. In this case, the resistance of the gain control amplifier part 29 becomes large and the bias current $I_X$ decreases in response to the negative temperature change, contrary to the preamplifier part 28. Hence, the operation of the gain control amplifier 26 itself is also stable with respect to the temperature.

Therefore, the receiver circuit 21 which is a combination of the preamplifier part 28 and the gain control amplifier part 29 carries out a stable operation even when a temperature change occurs, and the current consumption of the receiver circuit 21 as a whole is also stable with respect to the temperature change.

In other words, the first bias circuit 22 has a positive temperature characteristic which is dependent on the diodes, and a feedback is made to the preamplifier 23 so as to maintain the gain constant. For this reason, when the ambient temperature increases, the base-emitter voltages $V_{BE}$ (diode voltages $V_D$) decrease and the resistances increase. The increase in the bias current with increasing ambient temperature prevents the deterioration of the frequency band caused by the increase in the resistance. In addition, since the first bias circuit 22 and the preamplifier 23 have similar structure in terms of the number of diodes, transistors and resistor coupled between the power sources, it is possible to prevent a change in the output characteristic of the preamplifier part 28 such as changes in the offset, phase margin and the like.

On the other hand, the second bias circuit 25 has a negative temperature characteristic which is dependent on the resistances, and the gain control amplifier 26 has a circuit structure which operates as a multiplying circuit. A deviation $\Delta V_O$ in the output voltage $V_O$ of the gain control amplifier 26 can be described by the following formula, where $K = R_O/R_Y$, $\Delta V_X$ denotes a deviation of the gain control voltage $V_X$ and $\Delta V_Y$ denotes a deviation of the main input voltage $V_Y$.

$$\Delta V_O = [K/(I_X \cdot R_X)] \cdot \Delta V_X \cdot \Delta V_Y$$

As may be seen from the formula described above, the deviation $\Delta V_O$ is dependent on a product of the bias current $I_X$ and the resistance $R_X$. When the ambient temperature increases, the resistances such as the resistance $R_X$ increases, but the bias currents such as the bias current $I_X$ decreases with increasing ambient temperature because the bias currents are determined by the constant voltages and resistances. Accordingly, the product $I_X \cdot R_X$ does not change, and the deviation $\Delta V_O$ remains constant. In addition, because the frequency band of the gain control amplifier 26 is sufficiently wide compared to that of the preamplifier 23, no problems are introduced by the change in the frequency band.

Therefore, according to this embodiment, the frequency band, gain and power consumption of the receiver circuit is constant with respect to an increase in the ambient temperature. For this reason, the operation of the receiver circuit is stable and the detection accuracy is improved especially with respect to a weak input signal.

FIG. 4 shows a modification of the second bias circuit 25. In FIG. 4, those parts which are the same as those corresponding parts in FIG. 3 are designated by the same reference numerals, and a description thereof will be omitted.

The bias circuit 25 operates when supplied with the power source voltage $V_{EE}$. The transistors Q9 and Q10 are paired transistors. The transistors Q11 and Q12 are also paired transistors. Further, the transistors Q14 and Q15 are also paired transistors. Three diodes D110, D120 and D130 are connected in series between the base of the transistor Q16 and the collector of the transistor Q10. The diodes D110, D120 and D130 form an activation circuit for making the bias circuit 25 active, and the diodes D110, D120 and D130 are connected in such a direction that the cathode of the diode D130 connects to the base of the transistor Q16. The series connected diodes D110, D120 and D130 are provided in parallel to the series connected transistors Q10 and Q12. A forward voltage drop across the series connected diodes D110, D120 and D130 is set greater than a voltage drop across the transistors Q10 and Q12 when these transistors Q10 and Q12 are ON.

When the power source voltage $V_{EE}$ is supplied to the bias circuit 25 shown in FIG. 4, the base current is supplied to the transistor Q16 via the diodes D110 through D130. Hence, the transistor Q16 turns ON, and the transistors Q14 and Q15 are turned ON by the emitter current of the transistor Q16. At the same time, the base current is supplied to the preamplifier 26. When the transistors Q14 and Q15 turn ON, the transistors Q9 through Q13 turn ON. As a result, the forward voltage drop of the diodes D110 through D130 becomes less than the voltage drop of the transistors Q10 and Q12, and the forward current flowing through the diodes D110 through D130 is cut off. Thus, the base current is supplied to the transistor Q16 from the collector of the transistor Q12. The transistor Q16 is maintained ON, and the bias voltage is supplied to the preamplifier 26. The bias circuit 25 is made active in the above described manner.

When the power source voltage $V_{EE}$ is supplied to the bias circuit 25 when activating the same, the forward current flows through the diodes D110 through D130 to activate the bias circuit 25. After the bias circuit 25 is made active by the activation circuit which is formed by the diodes D110 through D130, the forward current flowing through the diodes D110 through D130 is automatically cut off by the operation of the bias circuit 25. Therefore, it is unnecessary to provide an independent stop circuit for stopping the operation of the activation circuit in order to cut off the forward current which flows through the diodes D110 through D130, and the power consumption of the bias circuit 25 can be reduced considerably compared to the bias circuit which requires the stop circuit.

Next, a description will be given of a second embodiment of the receiver circuit according to the present invention, by referring to FIG. 5. In FIG. 5, those parts which are basically the same as those corresponding parts in FIG. 3 are designated by the same reference numerals, and a description thereof will be omitted.

In this embodiment, a shaping circuit 100 for shaping the output signal waveform of the preamplifier 23 is connected between the preamplifier 23 and the gain control amplifier 26 of a receiver circuit 21A. Hence, the gain control amplifier 26 receives a shaped signal output from the shaping circuit 100.

Of course, a capacitor coupling (as indicated in FIG. 6) circuit 200 may be employed to couple the preamplifier 23 and the gain control amplifier 26.

In the described embodiments, the first amplifier provided in the input stage is a preamplifier and the second amplifier provided in the output stage is a gain control amplifier. However, the first and second amplifiers are not limited to such amplifiers, and the effects of the present invention are obtainable as long as the first and second amplifiers are respectively driven by first and second bias circuits which are mutually independent and have mutually opposite temperature characteristics.

Further, the present invention is not limited to these embodiments, but various variations and modifications may be made without departing from the scope of the present invention.

What is claimed is:

1. A receiver circuit comprising:
   an input terminal means for receiving an input signal;
   a first amplifier means coupled to said input terminal for amplifying the input signal and for outputting a first amplified signal;
   a first bias circuit means coupled to said first amplifier for supplying a first bias current to said first amplifier, said first amplifier means and said first bias circuit means forming a first circuit part, said first bias circuit means having a first temperature characteristic;
   a second amplifier means coupled to said first amplifier for amplifying the first amplified signal output from said first amplifier and for outputting a second amplified signal;
   a second bias circuit means coupled to said second amplifier for supplying a second bias current to said second amplifier, said second amplifier means and said second bias circuit means forming a second circuit part, said second bias circuit means having a second temperature characteristic; and
   an output terminal means coupled to said second amplifier for outputting the second amplified signal output from said second amplifier as an output signal of said receiver circuit;
   said first and second bias circuit means being independent of each other and said first and second temperature characteristics of said first and second bias circuit means, respectively, being mutually opposite so that said first and second bias currents respectively change in mutually opposite directions with increasing ambient temperature to thereby suppress a change in current consumption of said receiver circuit as a whole.

2. The receiver circuit as claimed in claim 1, wherein said first bias circuit means has a positive temperature characteristic for increasing the first bias current with increasing ambient temperature so as to suppress a change in characteristic of said first circuit part with respect to a change in the ambient temperature, and said second bias circuit means has a negative temperature characteristic for decreasing the second bias current with increasing ambient temperature so as to suppress a change in characteristic of said second circuit part with respect to the change in the ambient temperature.

3. The receiver circuit as claimed in claim 1, wherein said first bias circuit means has a negative temperature characteristic for decreasing the first bias current with increasing ambient temperature so as to suppress a change in characteristic of said first circuit part with respect to a change in the ambient temperature, and said second bias circuit means has a positive temperature characteristic for increasing the second bias current with increasing ambient temperature so as to suppress a change in characteristic of said second circuit part with respect to the change in the ambient temperature.

4. The receiver circuit as claimed in claim 1, wherein said first bias circuit means includes a diode and said second bias circuit means includes a resistor, said temperature characteristic of said first bias circuit means being dependent on said diode, said temperature characteristic of said second bias circuit means being dependent on said resistor.

5. The receiver circuit as claimed in claim 1, wherein said first amplifier means includes a preamplifier and said second amplifier means includes a gain control amplifier.

6. The receiver circuit as claimed in claim 1, wherein an output of said first amplifier means is directly connected to an input of said second amplifier means.

7. The receiver circuit as claimed in claim 1, wherein an output of said first amplifier means is a capacitor coupled to an input of said second amplifier means.

8. The receiver circuit as claimed in claim 1, further comprising a shaping circuit coupled between an output of said first amplifier means and an input of said second amplifier means, said shaping circuit shaping a waveform of the first amplified signal.

9. The receiver circuit as claimed in claim 1, wherein said input signal is received from a sensing device selected from a group including a computer tomography device.

* * * * *